US010056225B2

(12) United States Patent
Gaff et al.

(10) Patent No.: US 10,056,225 B2
(45) Date of Patent: *Aug. 21, 2018

(54) ADJUSTING SUBSTRATE TEMPERATURE TO IMPROVE CD UNIFORMITY

(71) Applicant: Lam Research Corporation, Fremont, CA (US)

(72) Inventors: Keith William Gaff, Fremont, CA (US); Harmeet Singh, Fremont, CA (US); Keith Comendant, Fremont, CA (US); Vahid Vahedi, Oakland, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 531 days.

This patent is subject to a terminal disclaimer.

(21) Appl. No.: 14/139,238

(22) Filed: Dec. 23, 2013

(65) Prior Publication Data

US 2014/0110060 A1    Apr. 24, 2014

Related U.S. Application Data

(62) Division of application No. 12/966,506, filed on Dec. 13, 2010, now Pat. No. 8,642,480.

(60) Provisional application No. 61/286,653, filed on Dec. 15, 2009.

(51) Int. Cl.
| | |
|---|---|
| *C23C 16/00* | (2006.01) |
| *H01J 37/20* | (2006.01) |
| *H01L 21/67* | (2006.01) |
| *H01L 21/66* | (2006.01) |

(52) U.S. Cl.
CPC ........ *H01J 37/20* (2013.01); *H01L 21/67248* (2013.01); *H01L 22/20* (2013.01); *H01L 22/12* (2013.01); *H01L 2924/0002* (2013.01)

(58) Field of Classification Search
CPC ........................................................ H01L 22/20
USPC .................................................. 118/724, 728
See application file for complete search history.

(56) References Cited

U.S. PATENT DOCUMENTS

| | | | |
|---|---|---|---|
| 3,440,883 A | 4/1969 | Lightner | |
| 3,946,370 A * | 3/1976 | Schmidt | G11C 13/042 359/259 |
| 4,351,894 A * | 9/1982 | Yonezawa | H01L 21/033 204/192.25 |
| 5,255,520 A | 10/1993 | O'Geary et al. | |

(Continued)

FOREIGN PATENT DOCUMENTS

| | | |
|---|---|---|
| CN | 101111934 A | 1/2008 |
| CN | 102652352 A | 8/2012 |

(Continued)

OTHER PUBLICATIONS

Decision of Rejection dispatched Mar. 24, 2015 for Japanese Patent Appln. No. 2012-544478.

(Continued)

*Primary Examiner* — Keath T Chen

(57) ABSTRACT

A plasma etching system having a substrate support assembly with multiple independently controllable heater zones. The plasma etching system is configured to control etching temperature of predetermined locations so that pre-etch and/or post-etch non-uniformity of critical device parameters can be compensated for.

11 Claims, 2 Drawing Sheets

(56) References Cited

U.S. PATENT DOCUMENTS

| | | |
|---|---|---|
| 5,414,245 A * | 5/1995 | Hackleman ............ B41J 2/1603 219/543 |
| 5,504,471 A * | 4/1996 | Lund .................. B41J 2/355 338/320 |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,802,856 A * | 9/1998 | Schaper .................. B01L 7/52 118/724 |
| 5,851,298 A | 12/1998 | Ishii |
| 5,886,866 A | 3/1999 | Hausmann |
| 6,060,697 A | 5/2000 | Morita et al. |
| 6,095,084 A | 8/2000 | Shamouilian et al. |
| 6,100,506 A | 8/2000 | Colelli, Jr. et al. |
| 6,175,175 B1 | 1/2001 | Hull |
| 6,222,161 B1 | 4/2001 | Shirakawa et al. |
| 6,271,459 B1 | 8/2001 | Yoo |
| 6,353,209 B1 | 3/2002 | Schaper et al. |
| 6,403,403 B1 | 6/2002 | Mayer et al. |
| 6,475,336 B1 | 11/2002 | Hubacek |
| 6,483,690 B1 | 11/2002 | Nakajima et al. |
| 6,512,207 B1 | 1/2003 | Dress et al. |
| 6,523,493 B1 | 2/2003 | Brcka |
| 6,566,632 B1 | 5/2003 | Katata et al. |
| 6,612,673 B1 | 9/2003 | Giere et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,770,852 B1 | 8/2004 | Steger |
| 6,795,292 B2 | 9/2004 | Grimard et al. |
| 6,815,365 B2 | 11/2004 | Masuda et al. |
| 6,825,617 B2 | 11/2004 | Kanno et al. |
| 6,847,014 B1 | 1/2005 | Benjamin et al. |
| 6,858,361 B2 | 2/2005 | Mui et al. |
| 6,886,347 B2 | 5/2005 | Hudson et al. |
| 6,921,724 B2 | 7/2005 | Kamp et al. |
| 6,979,805 B2 | 12/2005 | Arthur et al. |
| 6,985,000 B2 | 1/2006 | Feder et al. |
| 6,989,210 B2 | 1/2006 | Gore |
| 7,075,031 B2 | 7/2006 | Strang et al. |
| 7,141,763 B2 | 11/2006 | Moroz |
| 7,173,222 B2 | 2/2007 | Cox et al. |
| 7,175,714 B2 | 2/2007 | Ootsuka et al. |
| 7,206,184 B2 | 4/2007 | Ennis |
| 7,230,204 B2 | 6/2007 | Mitrovic et al. |
| 7,250,309 B2 | 7/2007 | Mak et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,475,551 B2 | 1/2009 | Ghoshal |
| 7,480,129 B2 | 1/2009 | Brown et al. |
| 7,504,006 B2 | 3/2009 | Gopalraja et al. |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,136,820 B2 | 3/2012 | Morioka et al. |
| 8,168,050 B2 | 5/2012 | Lu |
| 8,207,476 B2 | 6/2012 | Tsukamoto et al. |
| 8,222,574 B2 | 7/2012 | Sorabji et al. |
| 8,441,764 B2 | 5/2013 | Blakes |
| 8,461,674 B2 | 6/2013 | Gaff et al. |
| 8,546,732 B2 | 10/2013 | Singh |
| 8,624,168 B2 | 1/2014 | Gaff et al. |
| 8,637,794 B2 | 1/2014 | Singh et al. |
| 8,642,480 B2 | 2/2014 | Gaff et al. |
| 8,963,052 B2 | 2/2015 | Benjamin et al. |
| 2002/0043528 A1 | 4/2002 | Ito |
| 2004/0200574 A1 | 10/2004 | Davis et al. |
| 2005/0007136 A1* | 1/2005 | Feder .................. G01R 31/2874 324/750.05 |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0090855 A1* | 5/2006 | Kimura ............ H01L 21/67109 156/345.52 |
| 2006/0191637 A1 | 8/2006 | Zajac et al. |
| 2006/0226123 A1 | 10/2006 | Birang |
| 2007/0125762 A1 | 6/2007 | Cui et al. |
| 2007/0296980 A1 | 12/2007 | Mak et al. |
| 2008/0105669 A1 | 5/2008 | Jyousaka et al. |
| 2008/0169282 A1 | 7/2008 | Sorabji et al. |
| 2008/0197121 A1* | 8/2008 | Carcasi ............ H01L 21/67103 219/158 |
| 2008/0202924 A1 | 8/2008 | Bluck et al. |
| 2009/0000738 A1 | 1/2009 | Benjamin |
| 2009/0173445 A1 | 7/2009 | Yeom et al. |
| 2009/0178764 A1 | 7/2009 | Kanno et al. |
| 2009/0183677 A1 | 7/2009 | Tian et al. |
| 2010/0163546 A1 | 7/2010 | Nanno et al. |
| 2010/0257871 A1 | 10/2010 | Venkatasubramanian et al. |
| 2011/0005682 A1 | 1/2011 | Savas et al. |
| 2011/0092072 A1 | 1/2011 | Singh |
| 2011/0033175 A1 | 2/2011 | Kasai et al. |
| 2012/0097661 A1 | 4/2012 | Singh |
| 2013/0072025 A1 | 3/2013 | Singh et al. |

FOREIGN PATENT DOCUMENTS

| | | |
|---|---|---|
| CN | 102668058 A | 9/2012 |
| JP | 601918 A | 1/1985 |
| JP | 621176 A | 1/1987 |
| JP | 06010391 | 3/1994 |
| JP | 2004152913 A | 5/2004 |
| JP | 2005123286 A | 5/2005 |
| JP | 20050294237 A | 10/2005 |
| JP | 2005347612 A | 12/2005 |
| JP | 2006-074067 A | 3/2006 |
| JP | 2006519497 A | 8/2006 |
| JP | 2007-081160 A | 3/2007 |
| JP | 2007082374 A | 3/2007 |
| JP | 2008117915 A | 5/2008 |
| JP | 2008288427 A | 11/2008 |
| JP | 2009170509 A | 7/2009 |
| JP | 2009267256 A | 11/2009 |
| JP | 2010153730 A | 7/2010 |
| KR | 201998028601 U | 8/1998 |
| KR | 1020050053464 A | 6/2005 |
| KR | 20050121913 A | 12/2005 |
| KR | 1020060067552 A | 6/2006 |
| KR | 20080058109 A | 6/2008 |
| WO | 2004077505 A2 | 9/2004 |

OTHER PUBLICATIONS

Notice of Reasons for Rejection issued by the Japanese Patent Office dated Nov. 10, 2015 in corresponding Japanese Patent Application No. 2015-142544, filed on Dec. 13, 2010, with full English Translation (11 pages).

Chinese Office Action issued by the Chinese Patent Office dated Oct. 10, 2015 in corresponding Chinese Application No. 201310628285.9 (5 pages).

International Search Report and Written Opinion dated Aug. 24, 2011 for PCT/US2010/003149.

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/~eayars/publications/bandgap.pdf.

(56) References Cited

OTHER PUBLICATIONS

Office Action (Notification of the Final Office Action) dated Apr. 26, 2016, by the Korean Patent Office in corresponding Korean Patent Application No. 10-2013-7012033, and a Partial English Translation of the Office Action. (5 pages).

Japanese Notification of Reasons for Rejection for Application No. JP2016-084093 dated Mar. 17, 2017.

\* cited by examiner

ADJUSTING SUBSTRATE TEMPERATURE TO IMPROVE CD UNIFORMITY

RELATED APPLICATION

This application is a divisional of U.S. Application No. 12/966,506 filed Dec. 13, 2010, which claims priority under 35 U.S.C. § 119 to U.S. Provisional Application No. 61/286,653 filed Dec. 15, 2009, the contents of which are incorporated herein by reference in its entirety.

BACKGROUND

With each successive semiconductor technology generation, diameters of substrates, e.g., wafers, tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non plasma applications such as electron beam deposition, as well as plasma applications, such as sputter deposition, plasma-enhanced chemical vapor deposition (PECVD), resist strip, and plasma etch.

Plasma etching systems available today are among those semiconductor fabrication tools which are subject to an increasing need for improved accuracy and repeatability. One metric for plasma etching systems is increased uniformity, which includes uniformity of process results on a semiconductor substrate surface as well as uniformity of process results of a succession of substrates processed with nominally the same input parameters. Continuous improvement of within-substrate uniformity is desirable. Among other things, this calls for plasma chambers with improved uniformity, consistency and self diagnostics.,

SUMMARY

Disclosed herein is a method of using a plasma etching system comprising a substrate support assembly for supporting a substrate during plasma etching, the substrate support assembly comprising a plurality of independently controllable heater zones in an arrangement under device die locations on the substrate, and a controller unit that controls each heater zone. The method comprises (a) measuring pre-etch, or post-etch critical device parameters from previously etched substrate, on the device die locations of the substrate on the substrate; (b) communicating the pre-etch or post-etch critical device parameters to the plasma etching system; (c) subsequently supporting the substrate on the substrate support assembly; (d) communicating process recipe parameters to the plasma etching system and/or loading process recipe parameters from a memory to the plasma etching system; (e) deducing target etching temperatures at pre-determined locations on the substrate from the process recipe parameters, target post-etch critical device parameter data, and the pre-etch critical device parameters from incoming substrates, and/or the post-etch critical device parameters from previously etched substrate; (f) adjusting temperature at each predetermined location based on the target etching temperature at the predetermined location using the controllable heater zones; and (g) plasma etching the substrate.

DETAILED DESCRIPTION

Figure 1:
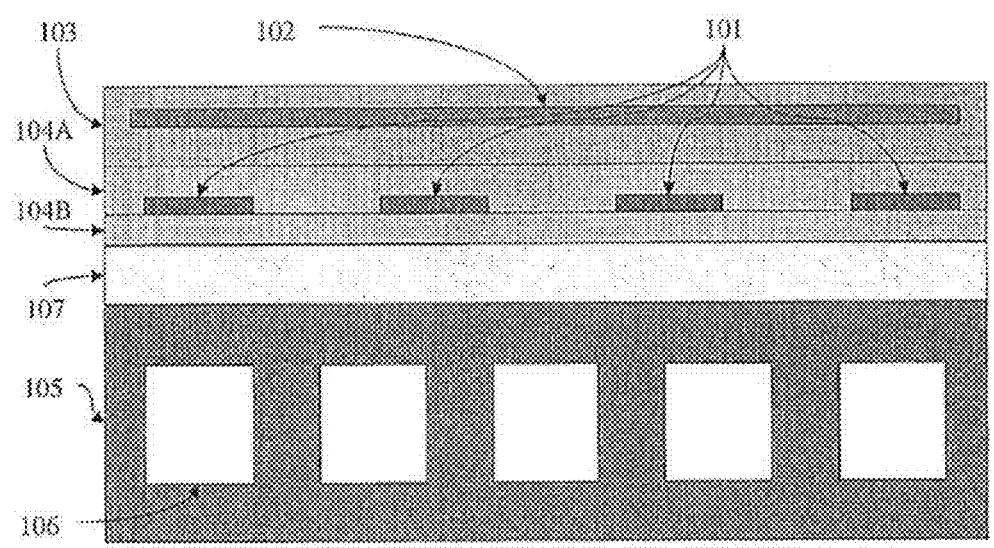
FIG. 1 is a schematic of the cross-sectional view of a substrate support assembly in which a heating plate with an array of heater zones is incorporated, the substrate support assembly also comprising an electrostatic chuck (ESC)

Radial and azimuthal substrate temperature control in a semiconductor processing apparatus to achieve target critical dimension (CD) uniformity on the substrate is becoming more demanding. Even a small variation of temperature may affect CD to an unacceptable degree, especially as CD approaches sub-20 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric heater zones to realize step by step and radial temperature control. Typically, the cooling plate is maintained between 0° C. and 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of heater zones, the substrate support temperature profile can be changed between center hot, center cold, and uniform. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the electrostatic chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

Non-uniformity in the critical dimension can be caused by upstream processes, for example, photolithography. Because of the parallel nature of photolithography (i.e. all device dies on a substrate are exposed together) and factors difficult to control such as light source non-uniformity, diffraction on photomasks, non-uniformity in temperature, non-uniformity in photoresist thickness, etc., post-lithography and pre-etch substrates usually have non-uniformity in device features. If unchecked and allowed to propagate to downstream processes, such non-uniformity can result in reduced device yield.

It would be advantageous and desirable to incorporate multiple independently controllable heater zones in the substrate support assembly to enable a plasma etching system to actively create and maintain the target spatial and temporal temperature profile, and to compensate for adverse factors that affect CD uniformity.

A substrate support assembly with independently controlled heater zones is described in U.S. patent application Ser. No. 12/582,991 filed on Oct. 21, 2009, which is hereby incorporated by reference.

Figure 2:
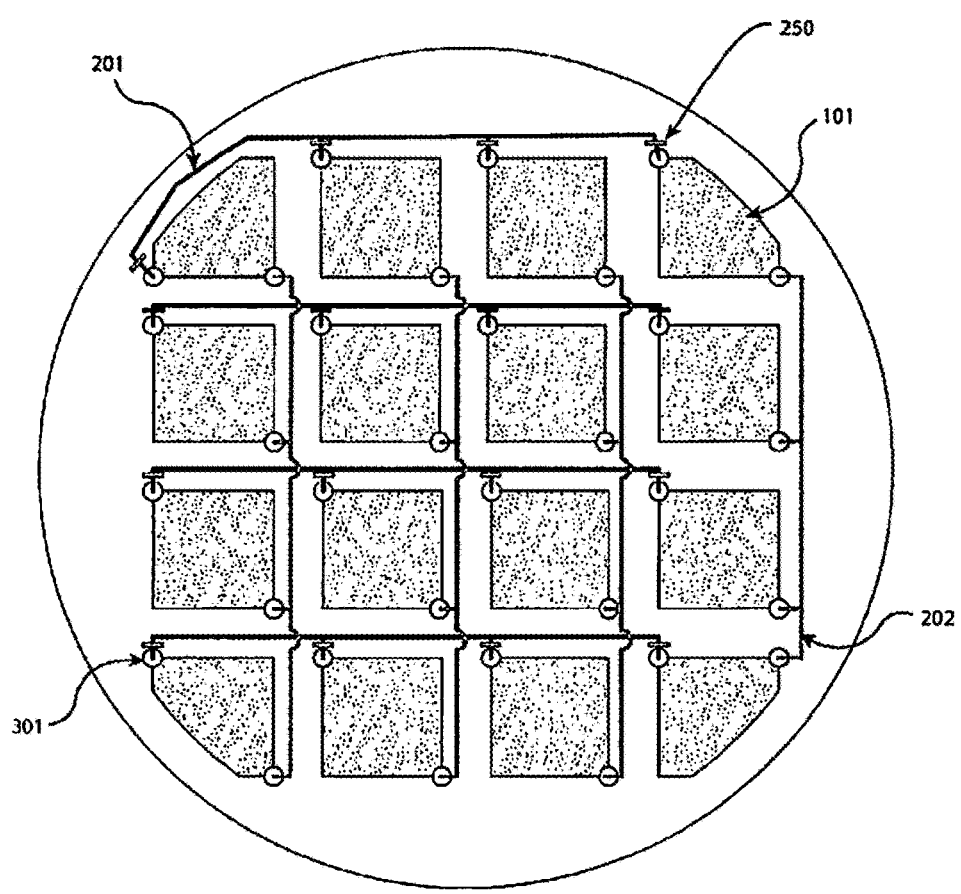
FIG. 2 illustrates the topology coal connection between power supply and power return lines to an array of heater zones in one embodiment of a heating plate which can be incorporated in a substrate support assembly.

FIGS. 1-2 show a substrate support assembly comprising one embodiment of the heating plate having an array of heater zones 101 incorporated in two electrically insulating layers 104A and 104B. The electrically insulating layers may be a polymer material, an inorganic material, a ceramic such as silicon oxide, alumina, yttria, aluminum nitride or other suitable material. The substrate support assembly further comprises (a) an ESC having a ceramic layer 103 (electrostatic clamping layer) in which an electrode 102 (e.g. monopolar or bipolar) is embedded to electrostatically clamp a substrate to the surface of the ceramic layer 103 with a DC voltage, (b) a thermal barrier layer 107, (c) a cooling plate 105 containing channels 106 for coolant flow.

As shown in FIG. 2, each of the heater zones 101 is connected to one of the power supply lines 201 and one of the power return lines 202. No two heater zones 101 share the same pair of power supply 201 and power return 202 lines. By suitable electrical switching arrangements, it is possible to connect a pair of power supply 201 and power return 202 lines to a power supply (not shown), whereby only the heater zone connected to this pair of lines is turned on. The time-averaged heating power of each heater zone can be individually tuned by time-domain multiplexing. In order to prevent crosstalk between different heater zones, a rectifier 250 (e.g. a diode) may be serially connected between each heater zone and the power supply lines connected thereto (as shown in FIG. 2), or between each heater zone and the power return lines connected thereto (not shown). The rectifier can be physically located in the heating plate or any suitable location. Alternatively, any current blocking arrangement such as solid state switches can be used to prevent crosstalk.

Described herein is a method of using a plasma etching system having a substrate support assembly with independently controllable heater zones, for compensation for non-uniformity on a substrate to be etched by measuring pre-etch critical device parameters, or post-etch critical device parameters from previously etched substrate, on a plurality of device die locations on the substrate and using the measured information to tune temperatures at predetermined locations on the substrate during etching.

For example, after a substrate undergoes lithography, a pattern is formed in a resist layer on the substrate. The pattern in the resist layer can have non-uniformity in critical dimensions. Pre-etch critical dimensions in the resist layer on each device die on the substrate can be measured with a suitable tool. The patterned resist layer is used as a mask in later plasma etching of the substrate underneath. Temperature during plasma etching can affect critical dimensions of the etched pattern in the substrate (post-etch critical dimensions). If the pre-etch critical dimensions at a device die location are determined to fall outside of tolerable error from target values, etching temperature of the device die location can be tuned by the heater zones such that the post-etch critical dimensions are within tolerable error from the target values. Thus, the measured pre-etch critical dimensions can be used to adjust etching temperature of each device die location to compensate for the particular amount of error in the pre-etch critical dimensions at the device die location.

The plasma etching system can have independently controllable heater zones assembled in a heating plate, and a controller unit that controls each heater zone. By tuning the power of each heater zone under control of the controller unit, the temperature profile during processing can be shaped both radially and azimuthally. The heater zones are preferably arranged in a defined pattern, for example, a rectangular grid, a hexagonal grid, or other pattern. Each heater zone of the heating plate is preferably of similar size (e.g. ±10%) to a single device die on the substrate. In an exemplary arrangement, to minimize the number of electrical connections, power supply and power return lines are arranged such that each power supply line is connected to a different group of heater zones and each power return line is connected to a different group of heater zones with each heater zone being in one of the groups connected to a particular power supply line and one of the groups connected to a particular power return line. No two heater zones are connected to the same pair of power supply and power return lines. Thus, a heater zone can be activated by directing electrical current through a pair of power supply and power return lines to which this particular heater zone is connected. The power of the heater elements is preferably smaller than 20 W, more preferably 5 to 10 W. The heater elements can be Peltier devices and/or resistive heaters such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. The thickness of the heater elements may range from 2 micrometers to 1 millimeter, preferably 5-80 micrometers. To allow space between heater zones and/or power supply and power return lines, the total area of the heater zones may be up to 90% of the area of the upper surface of the substrate support assembly, e.g. 50-90% of the area. The power supply lines or the power return lines (power lines, collectively) may be arranged in gaps ranging from 1 to 10 mm between the heater zones, or in separate planes separated from the heater zones plane by electrically insulating layers. The power supply lines and the power return lines are preferably made as wide as the space allows, in order to carry large current and reduce Joule heating. The power lines can be in the same plane as the heater zones, or can be on different planes than the heater zones. The materials of the power supply and power return lines may be the same as or different from the materials of the heater elements. Preferably, the materials of the power supply and power return lines are materials with low resistivity, such as Cu, Al, W, Inconel® or Mo. The substrate support assembly is operable to control the substrate temperature and consequently the plasma etching process at each device die location to maximize the yield of devices from the substrate. The plasma etching system preferably has at least 9 heater zones.

In one embodiment, the plasma etching system is able to receive measured critical device parameters (e.g. pre-etch critical dimensions) at a plurality of device die locations (preferably at least one location in each device die location) on a substrate to be processed therein (pre-etch critical device parameters), from sources such as a human user, an onboard measurement tool, a host network (a network that shares data between processing tools in a processing line) or the like. Preferably, the plasma etching system receives pre-etch critical device parameters of a batch of substrates to be processed, from an off-board inspection tool via a host communication network. Such off-board inspection tool can be an optical and/or electron beam inspection tool. The plasma etching system can have a hardware and/or software interface for receiving the pre-etch critical device parameters. The plasma etching system can have suitable software for processing the pre-etch critical device parameters.

The plasma etching system is also able to receive through a hardware and/or software interface and/or load from a memory, process recipe parameters that define dependence of target post-etch critical device parameters on the measured pre-etch critical device parameters and etching temperatures; and to deduce target etching temperature at predetermined locations on the substrate from the process recipe parameters, target post-etch critical device parameters, and measured pre-etch critical device parameters. Preferably, the plasma etching system is able to receive such process recipe parameters for each process recipe step.

Preferably, the plasma etching system is further able to calculate target control parameters (parameters that can be directly controlled such as power, voltage, current, etc.) for each heater zone based on the target etching temperature of each device die location to achieve the target critical device parameter for each device die.

The target control parameters can be obtained during manufacture of the substrate support assembly, by measuring response of surface temperatures of the substrate support assembly to different control parameters applied thereto. Alternatively, the target control parameters can be determined by using a theoretical or empirical model such as heat transfer theories or finite element analyses.

Preferably, a steady gain matrix can be used to calculate the target control parameters with direct response of each device die location to a control parameter applied to a heater zone underneath, and with indirect response (crosstalk) of said device die to control parameters applied to other heater zones. A steady gain matrix can be calculated using methods described in *Matrix Computation* by G. Golub, et al. (The Johns Hopkins University Press, Boston 1996), which is hereby incorporated by reference in its entirety.

In one embodiment, assuming the plasma etching system has n independent heater zones. Their respective control parameter is $X_i$ ($i=1, 2, \ldots, n$). All the control parameters $X_i$ can be written as a vector:

$$X = \begin{pmatrix} X_1 \\ X_2 \\ \vdots \\ X_n \end{pmatrix},$$

wherein $X_i$ is preferably time-averaged power applied to the i-th heater zone.

$T_i$ is a target etching temperature at a device die location within the i-th heater zone, which can be written as another vector:

$$T = \begin{pmatrix} T_1 \\ T_2 \\ \vdots \\ T_n \end{pmatrix},$$

The vector T is a function of the vector X. A relationship between the vector X and T can described by a n-by-n matrix K, wherein $T=K \cdot X$. Diagonal elements $K_{ii}$ can be measured during manufacture of the substrate support assembly or the plasma etching system. Off-diagonal elements $K_{ij}$ ($i \neq j$) can be measured during manufacture of the substrate support assembly or plasma etching system, or derived from a finite element thermal model, the values of diagonal elements and the physical distance between the i-th and j-th heater zones. The matrix K is stored in the plasma etching system. The plasma etching system also has software or firmware functional to execute an algorithm to deduce X based on T. The algorithm is a matrix inversion followed by a matrix multiplication, i.e. $X=K^{-1} \cdot T$.

In another embodiment, assuming the plasma etching system has n independent heater zones. Their respective control parameter is $X_i$ ($i=1, 2, \ldots, n$). All the control parameters $X_i$ can be written as a vector:

$$X = \begin{pmatrix} X_1 \\ X_2 \\ \vdots \\ X_n \end{pmatrix},$$

wherein $X_i$ is preferably time-averaged power applied to the i-th heater zone.

$P=\{P_j\}$ is a set of predicated etching temperatures at predetermined locations on the substrate at which the temperature response to each heater zone is known based on prior modeling or calibration measurements. P can be written as another vector:

$$P = \begin{pmatrix} P_1 \\ P_2 \\ \vdots \\ P_m \end{pmatrix},$$

$T=\{T_j\}$ are a set of target etching temperatures at the same predetermined locations on the substrate. T can be written as another vector:

$$T = \begin{pmatrix} T_1 \\ T_2 \\ \vdots \\ T_m \end{pmatrix},$$

In this embodiment, the number m of the locations on the substrate having respective target etching temperatures does not equal the number of heater zones, i.e., $m \neq n$. The locations having temperature response may differ from the locations of the heater zones. The vector P is a function of the vector X. A relationship between the vector P and T can be described by an m-by-n matrix K, wherein $P=K \cdot X$.

Elements $K_{ij}$ can be measured during manufacture of the substrate support assembly or plasma etching system, or derived from a finite element thermal model. The matrix K is stored in the plasma etching system. The plasma etching system also has software or firmware functional to execute an algorithm to deduce X based on T, using the matrix and an optimization algorithm, e.g., a least squares optimization. The optimization algorithm facilitates determination of heater power setpoints by minimizing the differences between predicted temperatures at device die locations and target temperatures at the respective locations on the substrate.

In the above embodiments, the location at which the substrate characteristics, e.g., CD measurements, are measured may differ from the number of heater zones. In addition, the locations at which the substrate characteristics are measured may not coincide with the locations at which temperature response for each heater zone is known based on modeling or previous measurements, e.g., during manufacturing. That is, the substrate characteristics measurement locations differ from those used to construct the matrix K. Consequently, the substrate characteristics need to be estimated at the same locations as those used to construct matrix K. In a preferred embodiment, a technique, such as linear or nonlinear interpolation, can be used to transform the data for the substrate characteristics, e.g. CD measurements, from the substrate characteristics measurement locations to the locations at which the individual heater responses have been modeled/measured during calibration, i.e., the locations used to construct matrix K.

In an alternative embodiment, the control parameters can be dynamically determined by a control circuit (e.g. a PID controller) based on output of temperature sensors (e.g. optical sensors, thermal couples, diodes, or the like) in each heater zone.

While the method of using a plasma etching system has been described in detail with reference to specific embodiments thereof, it will be apparent to those skilled in the art that various changes and modifications can be made, and equivalents employed, without departing from the scope of the appended claims.

We claim:

1. A plasma etching system comprising a substrate support assembly for supporting a substrate during plasma etching, the substrate support assembly comprising:
   an electrostatic chuck including a ceramic layer with an embedded electrode to electrostatically clamp the substrate to a surface of the ceramic layer when a DC voltage is applied to the embedded electrode during the plasma etching of the substrate, wherein RF power is applied across the embedded electrode and a showerhead electrode to strike plasma between the electrostatic chuck and the showerhead electrode;
   a plurality of heater zones that are independently controllable and that are arranged on a cooling plate under the substrate, the plurality of heater zones maintaining the surface supporting the substrate at temperatures above a temperature of the cooling plate and providing radial and azimuthal temperature control across the substrate in the presence of the plasma and the RF power,
   wherein the plurality of heater zones includes a plurality of power supply lines and a plurality of power return lines, each of the plurality of power supply lines is connected to at least two of the plurality of heater zones, each of the plurality of power return lines is connected to at least two of the plurality of heater zones, and each of the plurality of heater zones is connected to a different pair of the plurality of power supply and power return lines; and
   a controller configured to control each of the plurality of heater zones by deducing a target etching temperature for predetermined locations on the substrate based on pre-etch critical device parameters and post-etch critical device parameters from previously etched substrates and to adjust a temperature of each of the predetermined locations to a respective target etching temperature using the plurality of heater zones.

2. The plasma etching system of claim 1, comprising an interface that receives the pre-etch or the post-etch critical device parameters from an off-board inspection tool via a host communication network.

3. The plasma etching system of claim 1, wherein heater power setpoints for the plurality of heater zones are determined based on a matrix describing a relationship of target control parameters of the plurality of heater zones and predicted etching temperatures of the predetermined locations on the substrate.

4. The plasma etching system of claim 1, wherein the controller determines whether the pre-etch critical device parameters fall outside target values and controls the plurality of heater zones such that the post-etch critical device parameters are within the target values.

5. The plasma etching system of claim 1, wherein the plurality of heater zones is arranged in a grid.

6. The plasma etching system of claim 1, wherein the plurality of heater zones covers 50 to 90% of an area of an upper substrate support surface of the substrate support assembly.

7. The plasma etching system of claim 1, wherein each of the plurality of heater zones includes at least one resistive heater.

8. The plasma etching system of claim 1, wherein the plurality of heater zones includes at least 9 heater zones.

9. The plasma etching system of claim 1 further comprising a rectifier serially connected between each of the plurality of heater zones and one of the plurality of power supply lines or one of the plurality of power return lines connected thereto.

10. A plasma etching system comprising a substrate support assembly for supporting a substrate during plasma etching, the substrate support assembly comprising:
    an electrostatic chuck including a ceramic layer with an embedded electrode to electrostatically clamp the substrate to a surface of the ceramic layer when a DC voltage is applied to the embedded electrode during the plasma etching of the substrate, wherein RF power is applied across the embedded electrode and a showerhead electrode to strike plasma between the electrostatic chuck and the showerhead electrodes;
    a plurality of heater zones that are independently controllable and that are arranged on a cooling plate under the substrate, the plurality of heater zones maintaining the surface supporting the substrate at temperatures above a temperature of the cooling plate and providing radial and azimuthal temperature control across the substrate in the presence of the plasma and the RF power;
    wherein the plurality of heater zones are connected to power supply lines and power return lines, and wherein each of the power supply lines is connected to a different group of the plurality of heater zones than each of the power return lines; and
    wherein the plurality of heater zones are connected to power supply lines and power return lines such that no two heater zones from the plurality of heater zones are connected to the same pair of the power supply and power return lines; and a controller that controls each of the plurality of heater zones, wherein the controller deduces a target etching temperature for predetermined locations on the substrate based on pre-etch critical device parameters and post-etch critical device parameters from previously etched substrates and adjusts a temperature of each of the predetermined locations to a respective target etching temperature using the plurality of heater zones, and wherein heater power setpoints for the plurality of heater zones are determined based on a matrix describing a relationship of target control parameters of the plurality of heater zones and predicted etching temperatures of the predetermined locations on the substrate.

11. A substrate support assembly for supporting a substrate, the substrate support assembly comprising:

an electrostatic chuck including a ceramic layer with an embedded electrode to electrostatically clamp the substrate to a surface of the ceramic layer when a DC voltage is applied to the embedded electrode during plasma etching of the substrate, wherein RF power is applied across the embedded electrode and a showerhead electrode to strike plasma between the electrostatic chuck and the showerhead electrode;

a plurality of heater zones that are independently controllable and that are arranged on a cooling plate under the substrate, the plurality of heater zones maintaining the surface supporting the substrate at temperatures above a temperature of the cooling plate and providing radial and azimuthal temperature control across the substrate in the presence of the plasma and the RF power, the plurality of heater zones including a plurality of power supply lines and a plurality of power return lines, each of the plurality of power supply lines connected to at least two of the plurality of heater zones, each of the power return lines connected to at least two of the plurality of heater zones, each of the plurality of heater zones connected to a different pair of the plurality of power supply and power return lines, and a rectifier serially connected between each of the plurality of heater zones and one of the plurality of power supply lines or one of the plurality of power return lines connected thereto; and a controller to control each of the plurality of heater zones by deducing a target etching temperature for predetermined locations on the substrate based on pre-etch critical device parameters and post-etch critical device parameters from previously etched substrates and to adjust a temperature of each of the predetermined locations to a respective target etching temperature.

* * * * *